(12) United States Patent
Cho et al.

(10) Patent No.: US 6,384,438 B2
(45) Date of Patent: May 7, 2002

(54) CAPACITOR AND METHOD FOR FABRICATING THE SAME

(75) Inventors: Won Cheol Cho, Seoul; Kun Sik Park, Chungcheongbuk-do, both of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/902,648

(22) Filed: Jul. 12, 2001

Related U.S. Application Data (62) Division of application No. 09/455,791, filed on Dec. 7, 1999, now Pat. No. 6,284,551.

(30) Foreign Application Priority Data

Jun. 14, 1999 (KR) .............................................. 99-22051

(51) Int. Cl.[7] ........................ H01L 21/8242; H01G 7/06
(52) U.S. Cl. ...................................... 257/295; 257/306
(58) Field of Search .................................. 257/295–311

(56) References Cited

U.S. PATENT DOCUMENTS

| | | |
|---|---|---|
| 5,420,070 A | 5/1995 | Matsuura et al. |
| 5,474,951 A | * 12/1995 | Han et al. |
| 5,573,979 A | * 11/1996 | Tsu et al. |
| 5,583,068 A | 12/1996 | Jones, Jr. et al. |
| 6,174,735 B1 | 1/2001 | Evans |

* cited by examiner

Primary Examiner—Jey Tsai
(74) Attorney, Agent, or Firm—Birch, Stewart, Kolasch & Birch, LLP

(57) ABSTRACT

Capacitor and method for fabricating the same, which can simplify a fabrication process and reduce parasitic capacitances between signal lines, the capacitor including a first insulating layer formed on a substrate, a bitline patterned on the first insulating layer, a second insulating layer formed on the bitline, a first electrode formed on the second insulating layer with slopes at both sides, a dielectric film formed on the first electrode, a node contact formed on one side of the first electrode and in contact with the substrate, and a second electrode formed on the dielectric film and connected with the node contact electrically, and the method including the steps of (1) forming a first insulating layer on a substrate, and patterning a bitline on the first insulating layer, (2) forming a second insulating layer on an entire surface inclusive of the bitline, (3) depositing a first conductive material on the second insulating layer, (4) etching the first conductive material to form a first electrode with a sloped etch surface, (5) depositing a dielectric film on the first electrode, (6) etching the second insulating layer and the first insulating layer in succession to form a contact hole exposing the substrate, (7) depositing and etching a second conductive in the contact hole, to form a node contact, and (8) depositing and etching a third conductive material on the node contact, to form a second electrode.

5 Claims, 15 Drawing Sheets

CAPACITOR AND METHOD FOR FABRICATING THE SAME

This application is a divisional of U.S. patent application Ser. No. 09/455,791, filed on Dec. 7, 1999, now U.S. Pat. No. 6,284,551, the entire contents of which are hereby incorporated by reference and for which priority is claimed under 35 U.S.C. § 120; and this application claims priority of application Ser. No. 22051/1999 filed in Korea on Jun. 14, 1999 under 35 U.S.C. § 119.

BACKGROUND OF THE INVENTION

1. Field of the Invention

The present invention relates to a semiconductor device, and more particularly, to a capacitor and a method for fabricating the same, which can simplify a fabrication process and reduce parasitic capacitances between signal lines, which improves a device reliability.

2. Background of the Related Art

In general, there are the stack type and the trench type in the capacitors, and in turn there are the fin type and the cylinder type in the stack type. In order to secure a capacitance effectively, in general cylinder type of capacitors are used in 64MDRAM. However, in a case of 256MDRAM which is involved in a severe dimensional reduction, it is a general trend that an HSG(Hemi-Spherical Grain) is applied to a related art structure of the 256MDRAM for increasing a capacitance capacity.

A related art method for fabricating a capacitor will be explained with reference to the attached drawings. FIGS. 1A–1G illustrate sections showing the steps of a related art method for fabricating a capacitor.

Figure 1A:
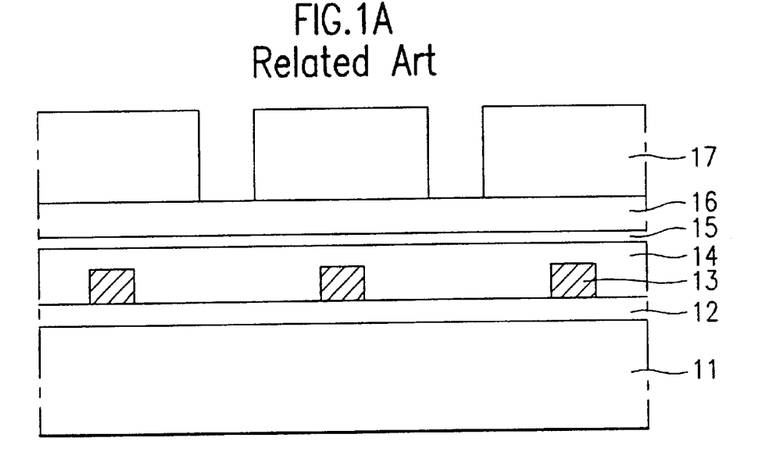
FIGS. 1A–1G illustrate sections showing the steps of a related art method for fabricating a capacitor.
Figure 1B:
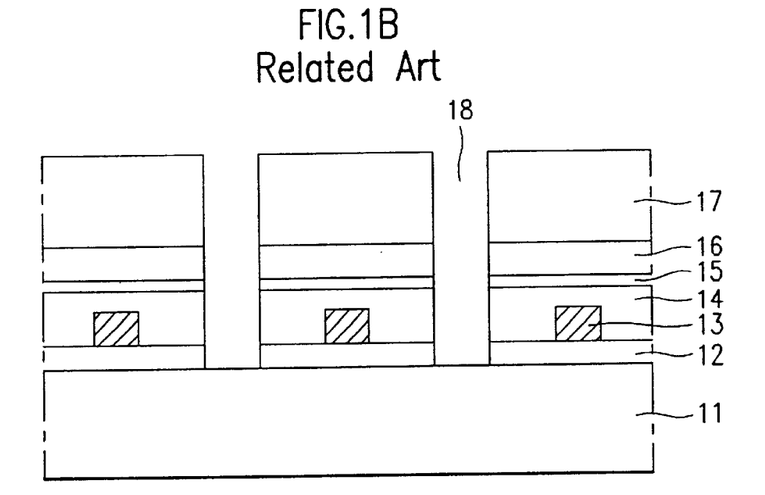
Figure 1C:
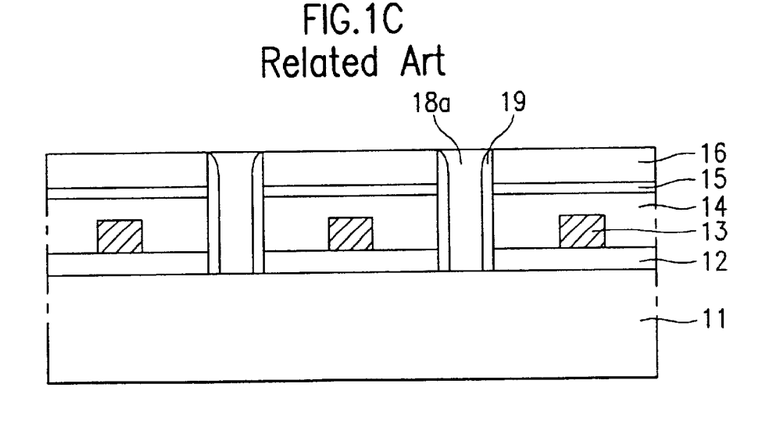
Figure 1D:
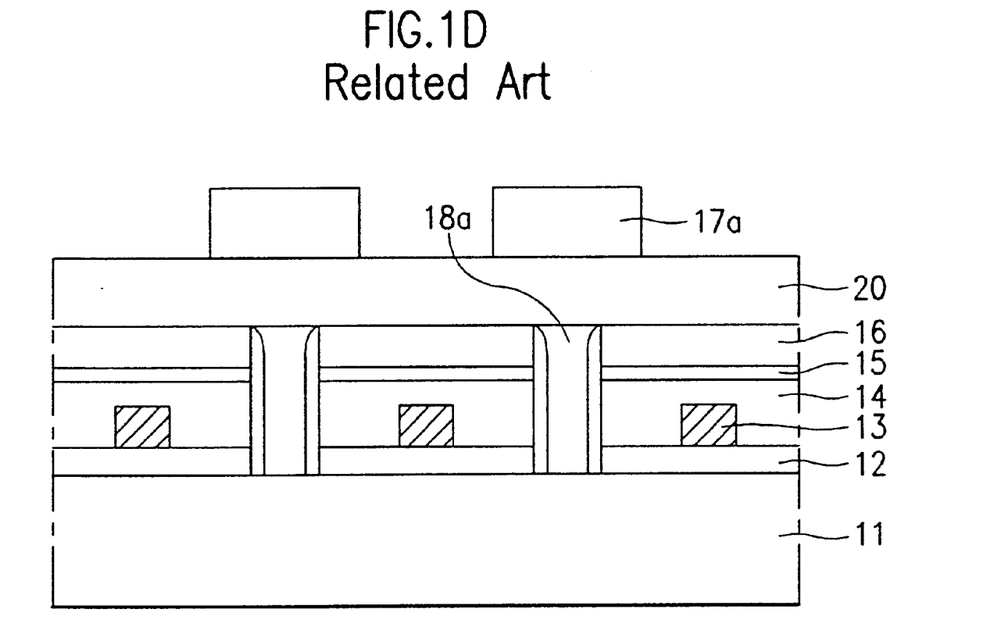
Figure 1E:
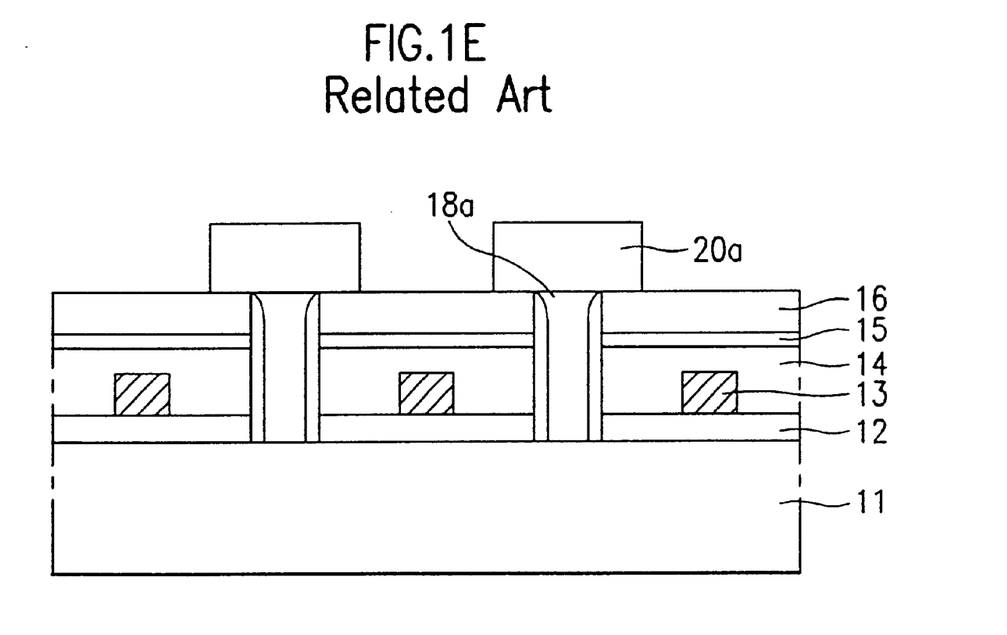
Figure 1F:
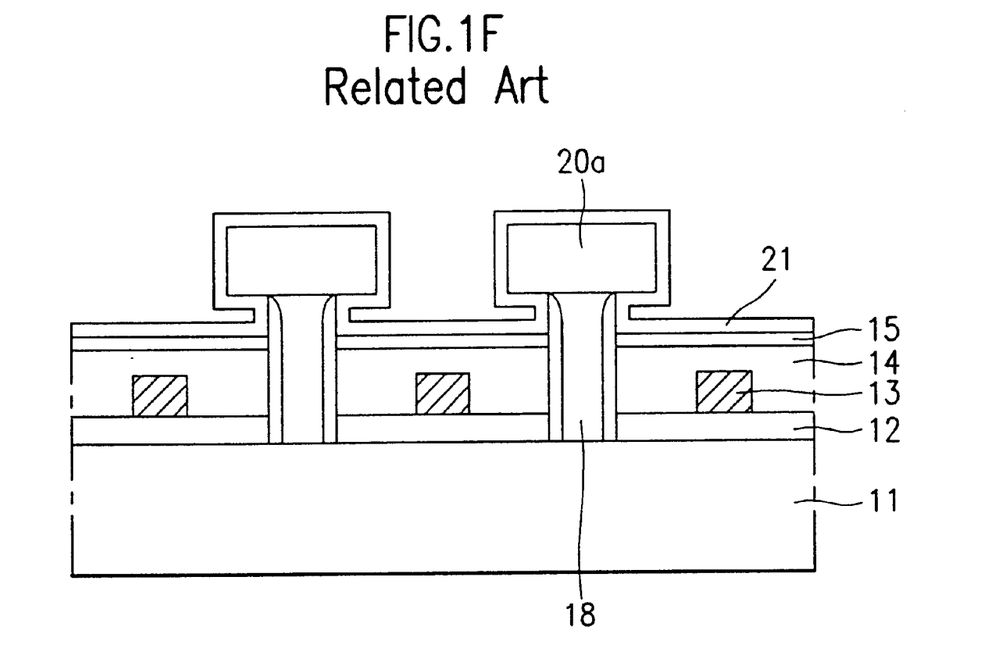
Figure 1G:
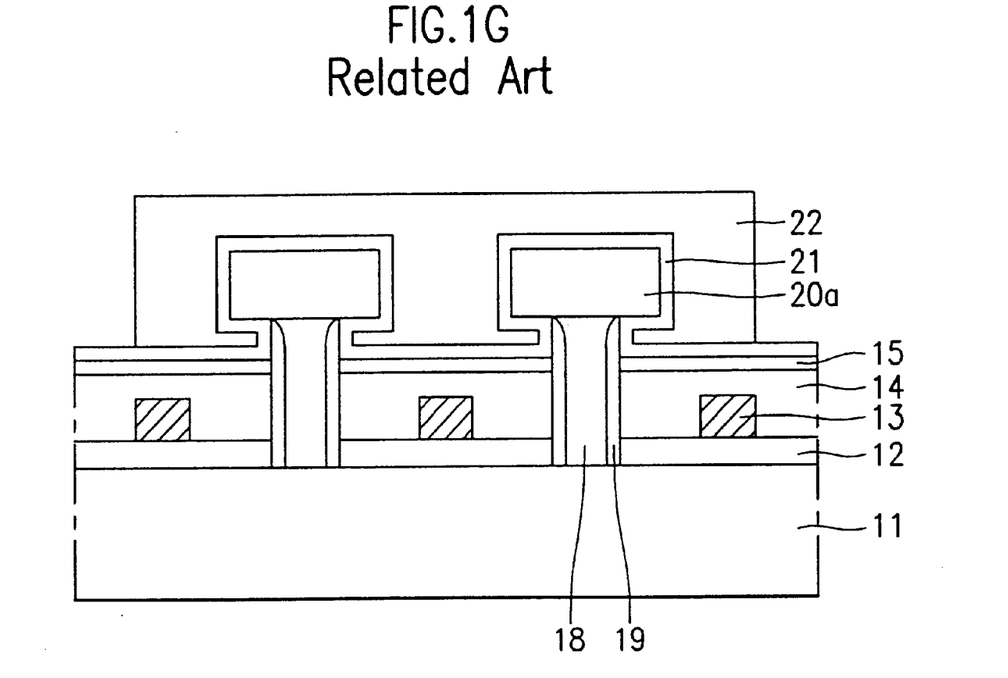

Referring to FIG. 1A, a first insulating layer 12 is formed on a semiconductor substrate 11 having a cell transistor formed thereon, and bitlines 13 are formed on the first insulating layer 12, selectively. A second insulating layer 14 is formed on the first insulating layer 12 inclusive of the bitline 13, planarized, and a silicon nitride film 15 is formed on the second insulating layer 14. A third insulating layer 16 is formed on the silicon nitride film 15, and a first photoresist 17 is coated on the third insulating layer 16, and subjected to patterning by exposure and development, to define a storage node contact region. As shown in FIG. 1B, the patterned first photoresist 17 is used as a mask in etching the third insulating layer 16, the silicon nitride film 15, the second insulating layer 14, and the first insulating layer 12 selectively, to form a storage node contact hole 18 which exposes a surface of the substrate 11. As shown in FIG. 1C, after the first photoresist 17 is removed, an insulating sidewall 19 is formed on an inside surface of the storage node contact hole 18. Then, a conductive material, such as polysilicon, for storage node contact is deposited on the third insulating layer 16 inclusive of the substrate, and planarized until the third insulating layer is exposed, to form a storage node contact 18a which is a conductive material stuffed in the storage node contact hole 18. As shown in FIG. 1D, a conductive material 20 for a capacitor lower electrode is formed on the third insulating layer 16 inclusive of the storage node contact 18a. And, a second photoresist 17a is coated on the conductive material 20 for capacitor lower electrode, and subjected to patterning by exposure and development, to define a capacitor lower electrode region. As shown in FIG. 1E, the patterned second photoresist 17a is used as a mask in etching the conductive material 20 for capacitor lower electrode selectively to remove the conductive material selectively, to form a capacitor lower electrode 20a electrically connected to the storage node contact 18a. As shown in FIG. 1F, the third insulating layer 16 is removed by wet etching to expose the silicon nitride film 15. And, a capacitor dielectric film 21 is deposited on the capacitor lower electrode 20a inclusive of the silicon nitride film 15. Then, as shown in FIG. 1G, upon formation of a capacitor upper electrode 22 on the capacitor dielectric film 21, the related art method for fabricating a capacitor is completed.

In the meantime, in the related art, if a ferroelectric film is used as a capacitor dielectric film, in order to prevent oxidization of the polysilicon of the storage node contact due to a strong oxidizing atmosphere, formation of an oxidization prevention film on the capacitor node contact is required.

However, the related art method for fabricating a capacitor has the following problems.

First, the parasitic capacitance between the storage node contact and the bitline taking place inevitably for devices 256MDRAM class and over with very small sized device affects a device reliability, greatly.

Second, in formation of a cylinder type capacitor, if a surface is extended down to a bottom surface of a capacitor lower electrode, a coupling parasitic capacitance is occurred between the capacitor upper electrode and the bitline with a dielectric film inbetween.

Third, if the capacitor dielectric film is formed of a ferroelectric material, formation an additional oxidizing prevention film is required for preventing the polysilicon of the storage node contact from being oxidized by the strong oxidizing atmosphere, resulting in a complicated fabrication process.

SUMMARY OF THE INVENTION

Accordingly, the present invention is directed to a capacitor and a method for fabricating the same that substantially obviates one or more of the problems due to limitations and disadvantages of the related art.

An object of the present invention is to provide a capacitor and a method for fabricating the same, which can simplify a fabrication process, and prevent parasitic capacitances between various signals lines, that improves a device reliability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the capacitor includes a first insulating layer formed on a substrate, a bitline patterned on the first insulating layer, a second insulating layer formed on the bitline, a first electrode formed on the second insulating layer with slopes at both sides, a dielectric film formed on the first electrode, a node contact formed on one side of the first electrode and in contact with the substrate, and a second electrode formed on the dielectric film and connected with the node contact, electrically.

In other aspect of the present invention, there is provided a method for fabricating a capacitor, including the steps of (1) forming a first insulating layer on a substrate, and patterning a bitline on the first insulating layer, (2) forming a second insulating layer on an entire surface inclusive of the bitline, (3) depositing a first conductive material on the second insulating layer, (4) etching the first conductive material to form a first electrode with a sloped etch surface, (5) depositing a dielectric film on the first electrode, (6) etching the second insulating layer and the first insulating layer in succession to form a contact hole exposing the substrate, (7) depositing 15 and etching a second conductive in the contact hole, to form a node contact, and (8) depositing and etching a third conductive material on the node contact, to form a second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. The present invention suggests formation of a capacitor lower electrode after formation of a capacitor upper electrode for preventing a parasitic capacitance between a bitline and a storage node contact as well as a coupling parasitic capacitance between a capacitor upper electrode and the bitline.

Figure 2:
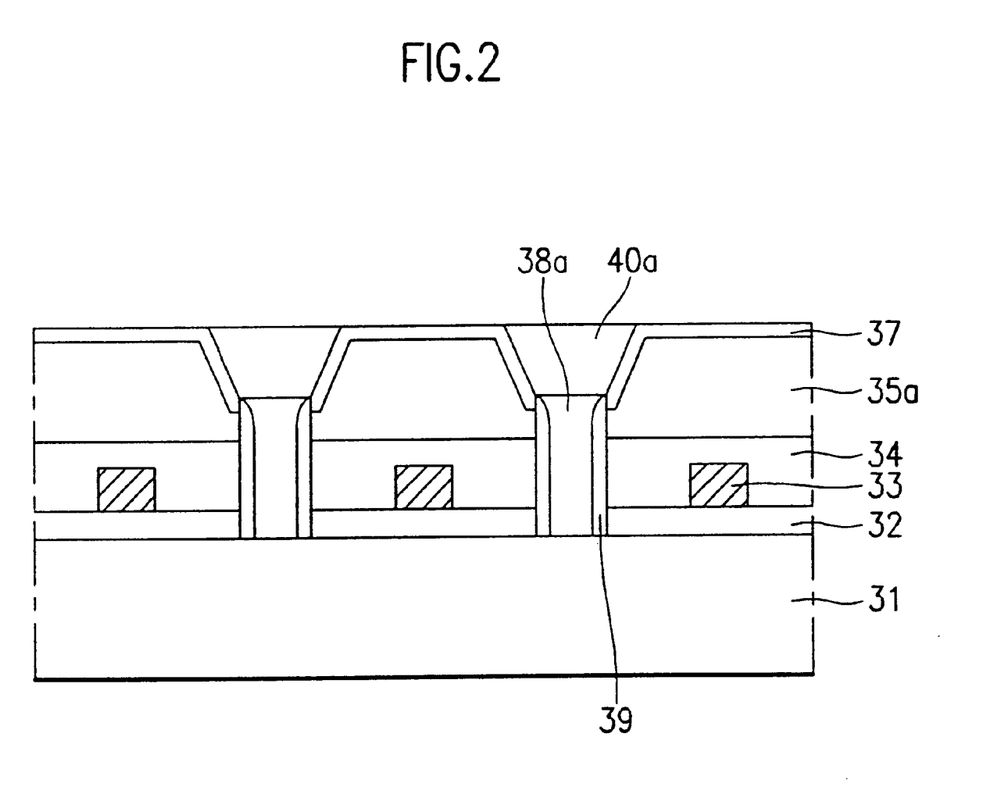
FIG. 2 illustrates a section of a capacitor in accordance with a first preferred embodiment of the present invention.

The capacitor and a method for fabricating the same of the present invention will be explained in detail. FIG. 2 illustrates a section of a capacitor in accordance with a first preferred embodiment of the present invention.

Referring to FIG. 2, the capacitor in accordance with a first preferred embodiment of the present invention includes a semiconductor substrate 31 having a plurality of cell transistors and impurity diffusion regions formed therein, a plurality of bitlines 33 formed on the semiconductor substrate 31 at fixed intervals with an insulating film 32 provided inbetween, capacitor upper electrodes 35a formed on the bitlines 33 with an insulating layer 34 inbetween having slopes at both sides, a capacitor dielectric film 37 formed on each of the capacitor upper electrodes 35a, a storage node contact 38a electrically connected to the substrate at a position between adjacent bitlines, and a capacitor lower electrode 40a formed between the dielectric films 37 on the storage node contact 38a. The insulating layer between the bitlines 33 and the capacitor upper electrodes 35a is a stack of a silicon nitride film and a silicon oxide film. The silicon nitride film acts as an etch termination point in formation of the capacitor upper electrode, and both sides of the capacitor upper electrode have a slope. Insulating sidewalls 39 are provided at both sides of the storage node contact which is in turn electrically insulated from the capacitor upper electrode 35a by the insulating sidewalls 39.

A method for fabricating a capacitor in accordance with a first preferred embodiment of the present invention will be explained, with reference to FIGS. 3A–3G. FIGS. 3A–3G illustrate sections showing the steps of a method for fabricating a capacitor in accordance with a first preferred embodiment of the present invention.

Figure 3A:
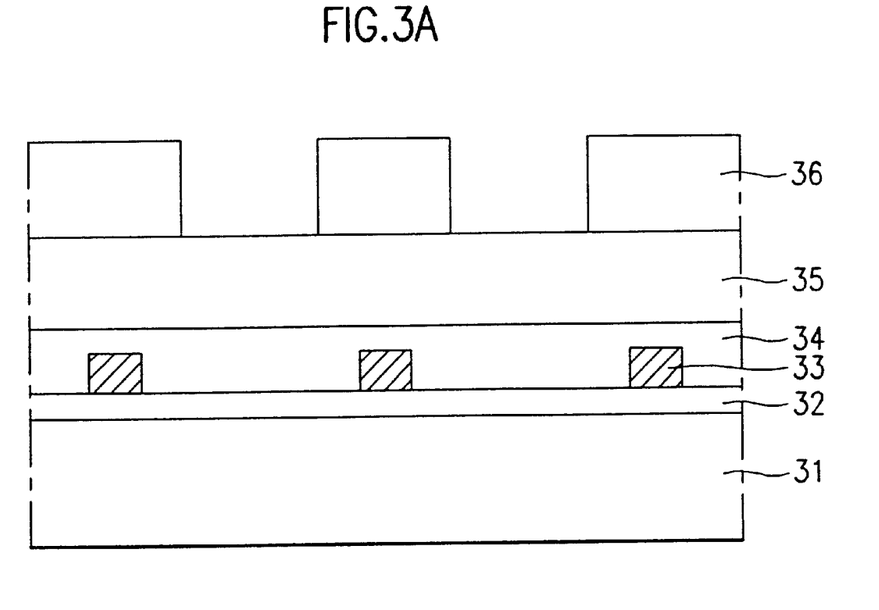
FIGS. 3A–3G illustrate sections showing the steps of a method for fabricating a capacitor in accordance with a first preferred embodiment of the present invention.
Figure 3B:
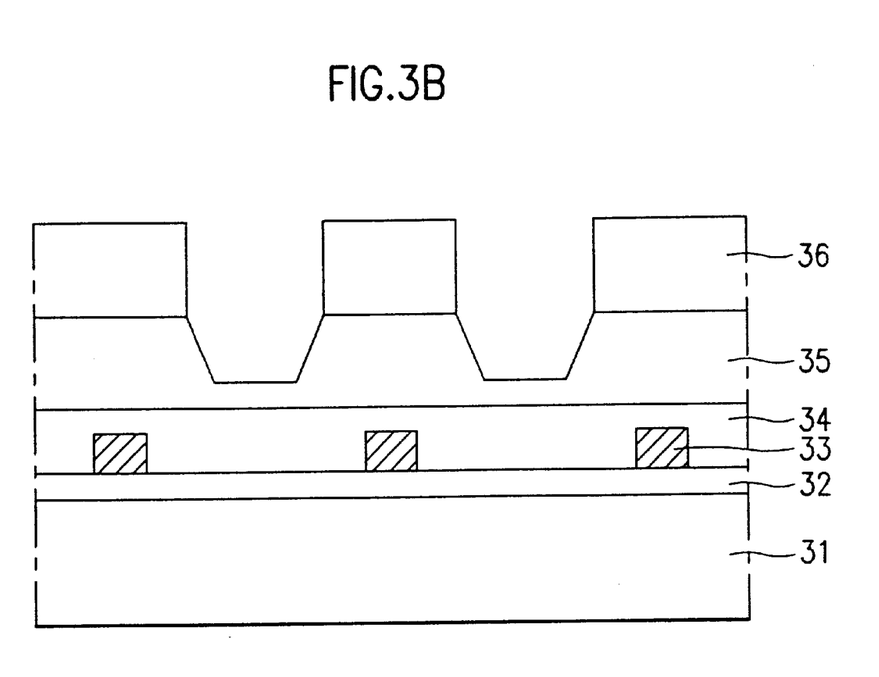
Figure 3C:
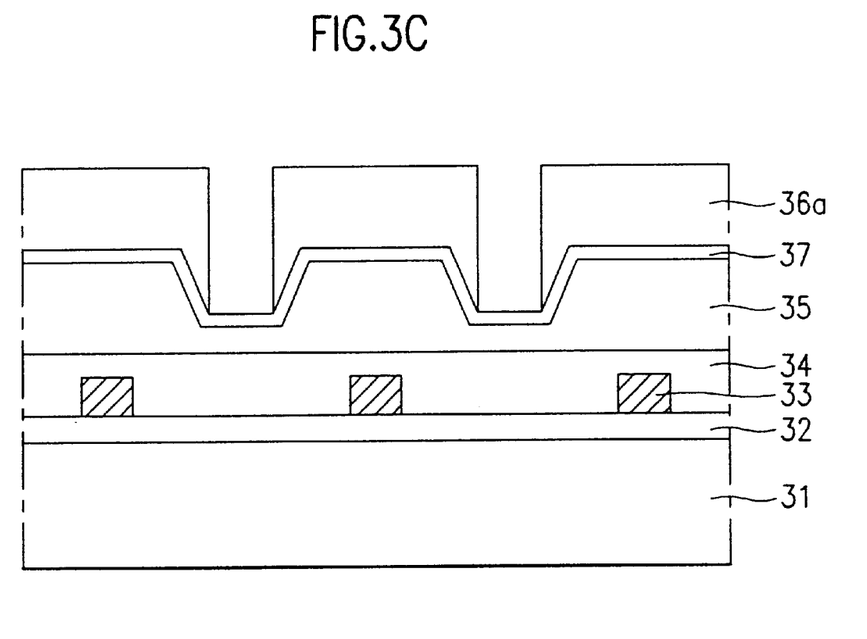
Figure 3D:
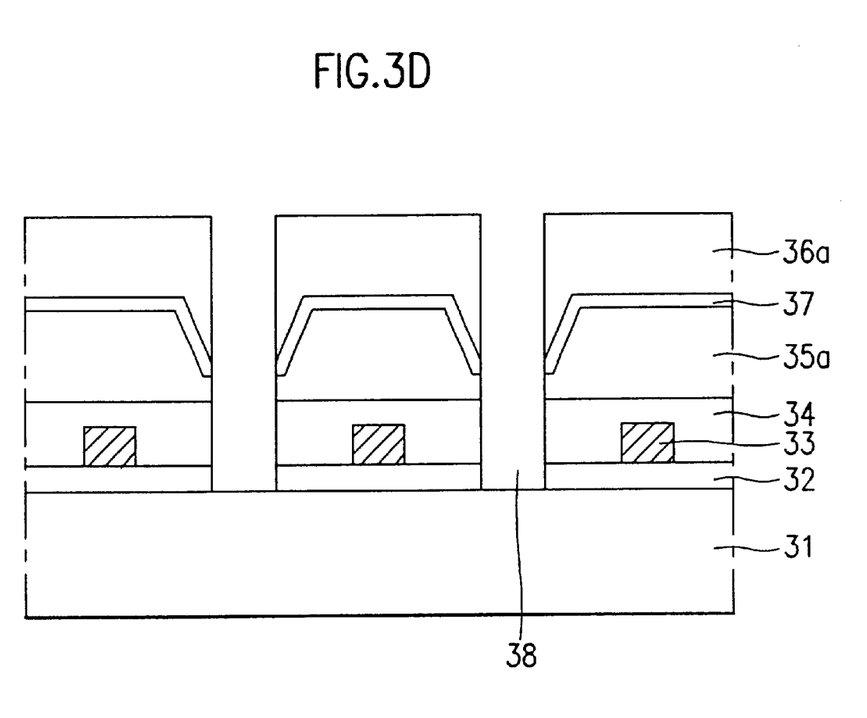
Figure 3E:
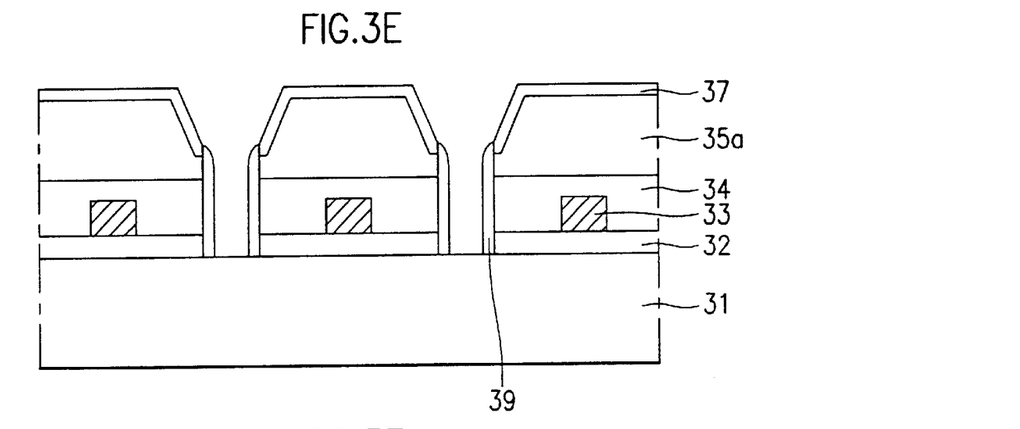
Figure 3F:
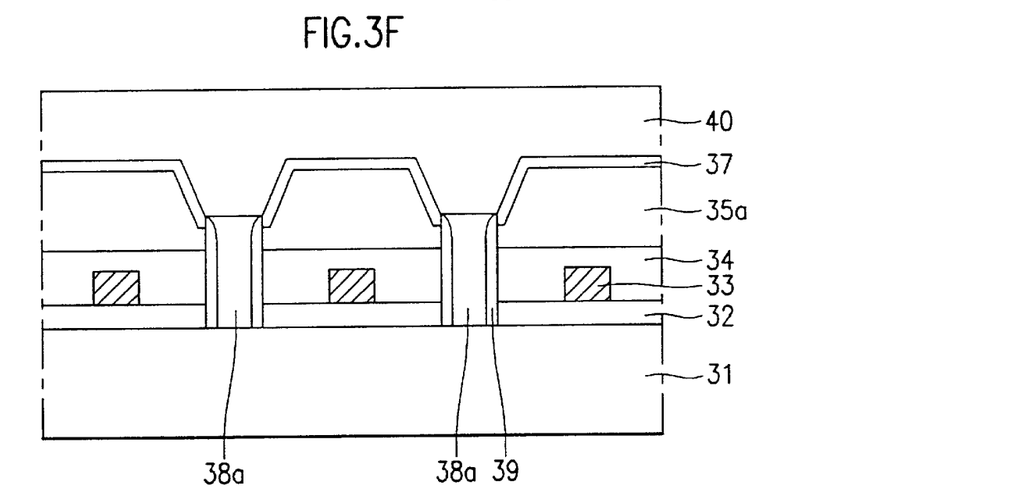
Figure 3G:
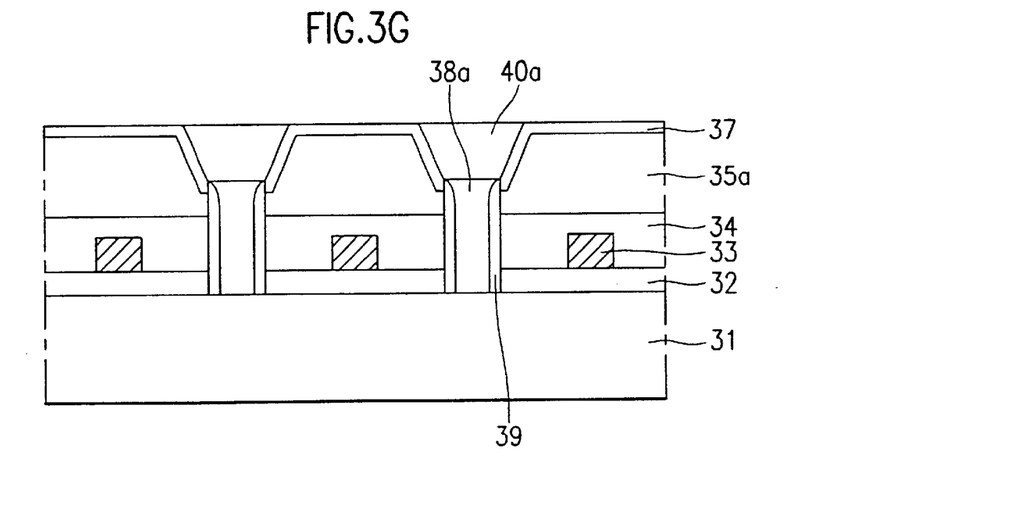

Referring to FIG. 3A, a first insulating layer 32 is formed on a semiconductor substrate 31 having a plurality of cell transistors and impurity diffusion regions formed therein, and bitlines 33 are formed on the first insulating layer 32, selectively. A second insulating layer 34 is formed on the first insulating layer 32 inclusive of the bitlines 33, planarized, and a first conductive material 35 for capacitor upper electrode is formed on the second insulating layer 34. A first photoresist 36 is coated on the first conductive material 35, and patterned, to define capacitor upper electrode regions. Then, as shown in FIG. 3B, the patterned first photoresist 36 is used as a mask in selectively etching and removing the first conductive material 35. The first conductive material 35 is etched down to a depth which does not expose the second insulating layer 34 and such that an etched surface has a slope. Then, as shown in FIG. 3C, the first photoresist 36 is removed, and a capacitor dielectric film 37 is formed on an entire surface inclusive of the first conductive material 35. And, a second photoresist 36a is coated on the capacitor dielectric film 37, and subjected to patterning by exposure and development, to define a storage node contact region. As shown in FIG. 3D, the patterned second photoresist 36a is used as a mask in etching and removing the capacitor dielectric film 37, a remained first conductive material 35, the second insulating layer 34 and the first insulating layer 32, to form a storage node contact hole 38 exposing the substrate(impurity diffusion region). In this instance, the first conductive material 35 is patterned to form a capacitor upper electrode 35a. Then, as shown in FIG. 3E, the second photoresist 36a is removed, and an insulating sidewall 39 is formed on an inside surface of the storage node contact hole 38. The insulating sidewall 39 is formed by depositing an insulating film on an entire surface of the substrate inclusive of the storage node contact hole 38 and etching back the insulating film, when the insulating film is not remained, but remove from both sides of the capacitor upper electrode 35a entirely in the etch back due to the slope of the capacitor upper electrode 35a. Then, as shown in FIG. 3F, a second conductive material for storage node contact is deposited on an entire surface inclusive of the insulating sidewall 39, and etched back, to form a storage node contact 38a stuffed in the storage node contact hole 38. And, a third conductive material 40 for capacitor lower electrode is formed on an entire surface inclusive of the storage node contact 38a. Then, as shown in FIG. 3G, the third conductive material is etched back until a surface of the capacitor dielectric film 37 is exposed, to form the capacitor lower electrode 40a, completing the method for fabricating a capacitor in accordance with a first preferred embodiment of the present invention. Since the capacitor lower electrode is formed above the capacitor upper electrode according to the first preferred embodiment of the present invention, the parasitic capacitance between the lower electrode and the bitline can be minimized.

Figure 4:
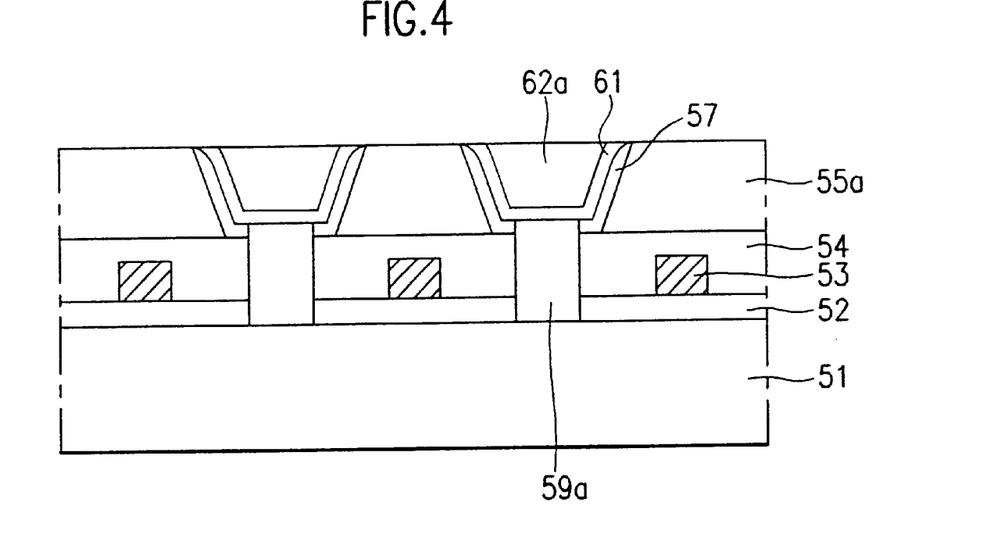
FIG. 4 illustrates a section of a capacitor in accordance with a second preferred embodiment of the present invention.

In the meantime, FIG. 4 illustrates a section of a capacitor in accordance with a second preferred embodiment of the present invention, wherein a reaction prevention film is additionally provided in comparison to the first embodiment.

A method for fabricating a capacitor in accordance with a second preferred embodiment of the present invention will be explained with reference to FIGS. 5A–5G. FIGS. 5A–5G illustrate sections showing the steps of a method for fabricating a capacitor in accordance with a second preferred embodiment of the present invention.

Figure 5A:
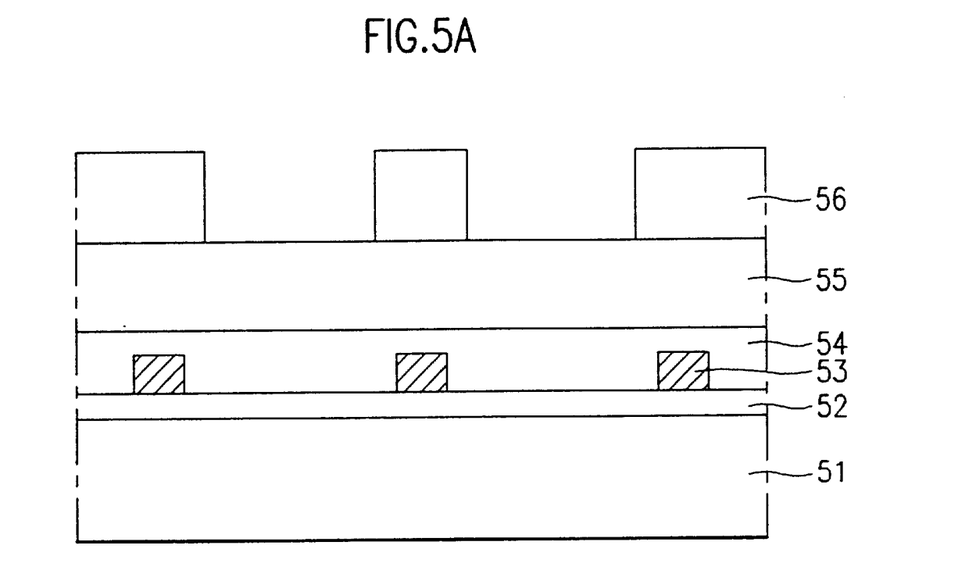
FIGS. 5A–5G illustrate sections showing the steps of a method for fabricating a capacitor in accordance with a second preferred embodiment of the present invention.
Figure 5B:
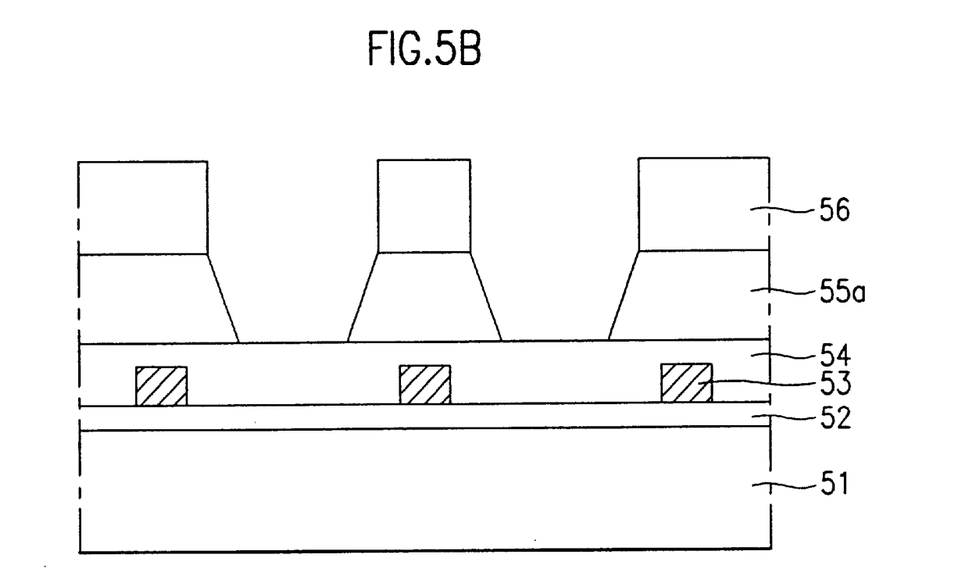
Figure 5C:
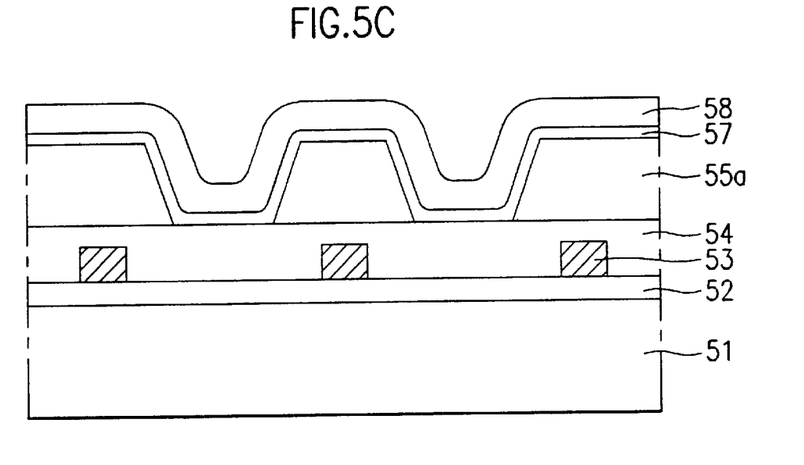
Figure 5D:
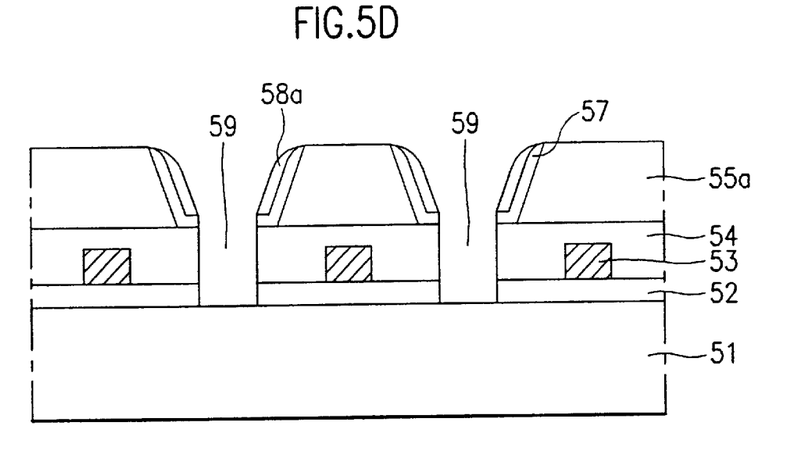
Figure 5E:
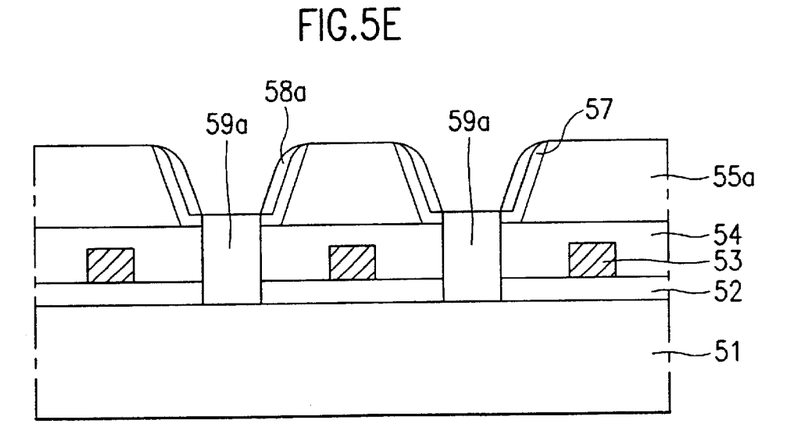
Figure 5F:
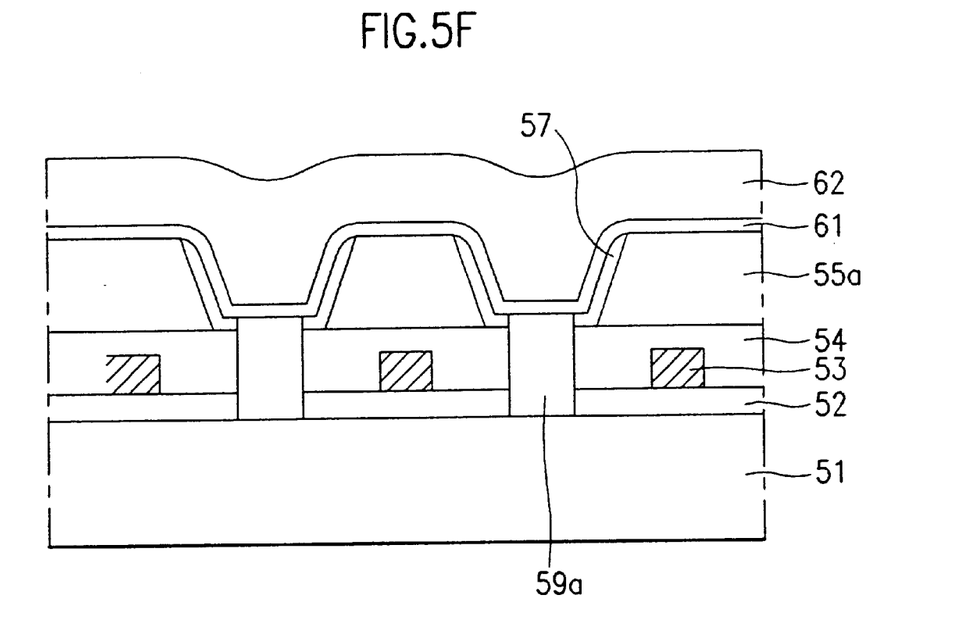
Figure 5G:
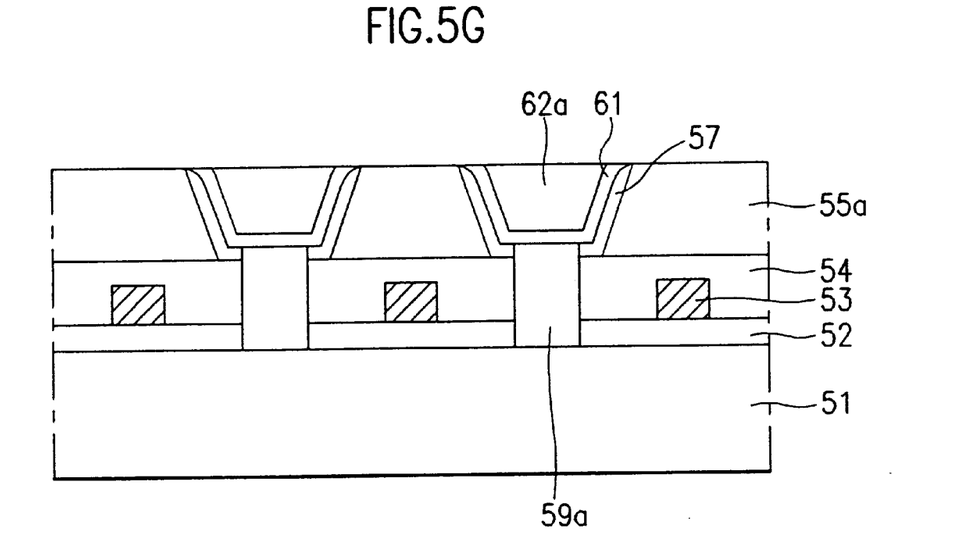

Referring to FIG. 5A, a first insulating layer 52 is formed on a semiconductor substrate 51 having a plurality of cell transistors and impurity regions formed therein, and bitlines 53 are formed on the first insulating layer 52, selectively. A second insulating layer 54 is formed on the first insulating layer 52 inclusive of the bitlines 53, and a first conductive material layer 55 for capacitor upper electrode is formed on the second insulating layer 54. A first photoresist 56 is coated on the first conductive material 55, and patterned, to define a capacitor upper electrode. Then, as shown in FIG. 5B, the patterned first photoresist 56 is used as a mask in selectively etching and removing the first conductive material 55, to form a capacitor upper electrode 55a. In etching the first conductive material 55 for forming a capacitor upper electrode 55a, the etching is conducted such that an etch surface has a slope, and the portion of the first conductive material 55 which is removed is a portion in which a lower electrode is to be formed. Accordingly, it can be known that only one time of photolithography can define regions for forming an upper electrode and a lower electrode. Then, as shown in FIG. 5C, the first photoresist 56 is removed, and a capacitor dielectric film 57 is deposited on an entire surface inclusive of the capacitor upper electrode 55a, and a third insulating layer 58 is formed on the capacitor dielectric film 57. As shown in FIG. 5D, the third insulating layer is etched back, to form sidewall spacers 58a on the capacitor dielectric film 57 at sides of the capacitor upper electrode 55a. Then, the sidewall spacers 58a are used as masks in etching and removing the capacitor dielectric film 57, the second insulating layer 54, and the first insulating layer 52, to form a storage node contact hole 59 to expose the substrate 51 (impurity diffusion regions). As shown in FIG. 5E, a conductive material is stuffed only in the storage node contact hole 59, to form a storage node contact 59a. As shown in FIG. 5F, wet etching is used in removing the sidewall spacers 58a only, and a reaction prevention film 61 is formed on an entire surface inclusive of the storage node contact 59a, for preventing the storage node contact from making reaction with a capacitor lower electrode which will be formed later. The reaction prevention film 61 is formed of a conductive material, in general, platinum Pt. Then, as shown in FIG. 5G, after deposition of a conductive material 62 for capacitor lower electrode on the reaction prevention film 61, the conductive material 62 for capacitor lower electrode and the reaction prevention film 61 are etched back until a surface of the capacitor upper electrode 55a is expose, to form a capacitor lower electrode 62a at sides of the capacitor upper electrode between the capacitor dielectric film 57 and the reaction prevention film 61. Upon formation of an interlayer insulating film(not shown) on an entire surface inclusive of the capacitor lower electrode 62a, the method for fabricating a capacitor in accordance with a second preferred embodiment of the present invention is completed. Though not shown in the drawings, a process for forming an insulating wall of an insulating film on an inside surface of the storage node contact hole 59 may be applied.

Figure 6:
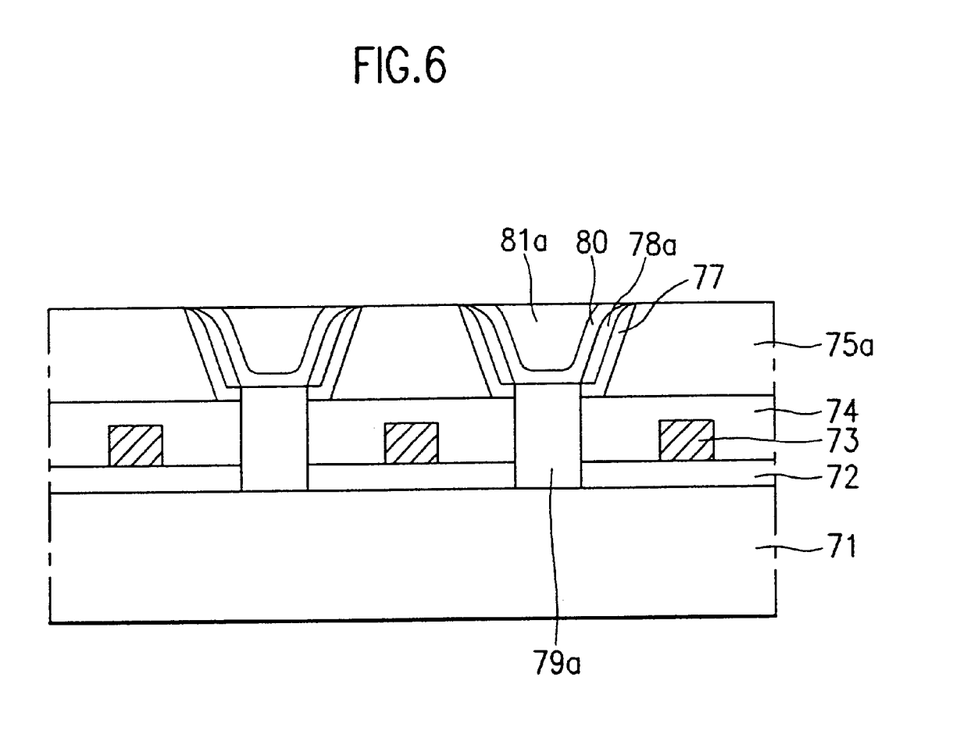
FIG. 6 illustrates a section of a capacitor in accordance with a third preferred embodiment of the present invention; and, FIGS. 7A–7G illustrate sections showing the steps of a method for fabricating a capacitor in accordance with a third preferred embodiment of the present invention.

In the meantime, FIG. 6 illustrates a section of a capacitor in accordance with a third preferred embodiment of the present invention, including a semiconductor substrate 71 having a plurality of cell transistors and impurity diffusion regions formed therein, a first insulating layer 72 formed on the semiconductor substrate 71, a plurality of bitlines 73 formed on the first insulating layer selectively, a second insulating layer 74 formed on an entire surface inclusive of the bitlines 73, storage node contacts 79a each formed between the bitlines 73 and connected to the semiconductor substrate 71 electrically, capacitor upper electrodes 75a on both sides of the storage node contact 79a, a capacitor dielectric film 77 on a surface of the capacitor upper electrode 75a, conductive sidewalls 78a formed on the capacitor dielectric film 77, a conductive reaction prevention film 80 formed on the storage node contact 79a inclusive of the conductive sidewall, and a capacitor lower electrode 81a formed on the reaction prevention film 80. The reaction prevention film is formed of platinum Pt.

A method for fabricating a capacitor in accordance with a third preferred embodiment of the present invention will be explained with reference to FIGS. 7A–7G. FIGS. 7A–7G illustrate sections showing the steps of a method for fabricating a capacitor in accordance with a third preferred embodiment of the present invention.

Figure 7A:
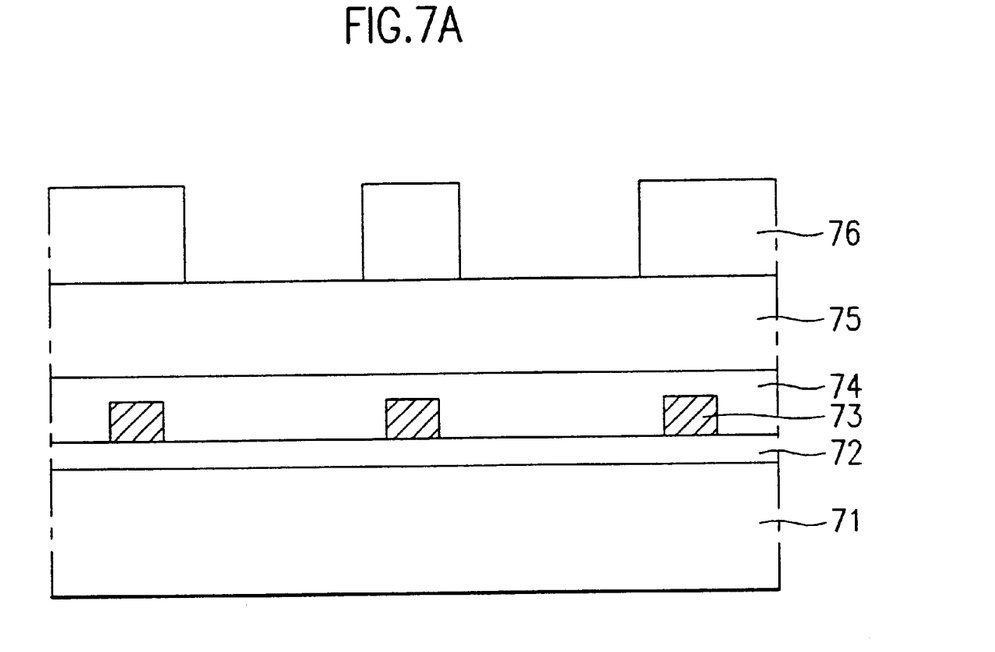
Figure 7B:
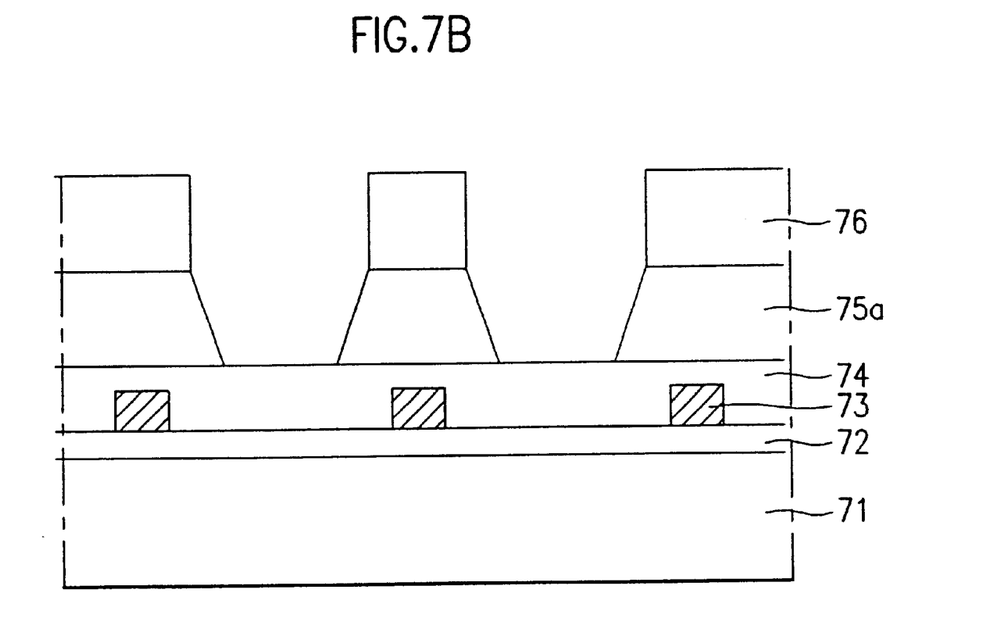
Figure 7C:
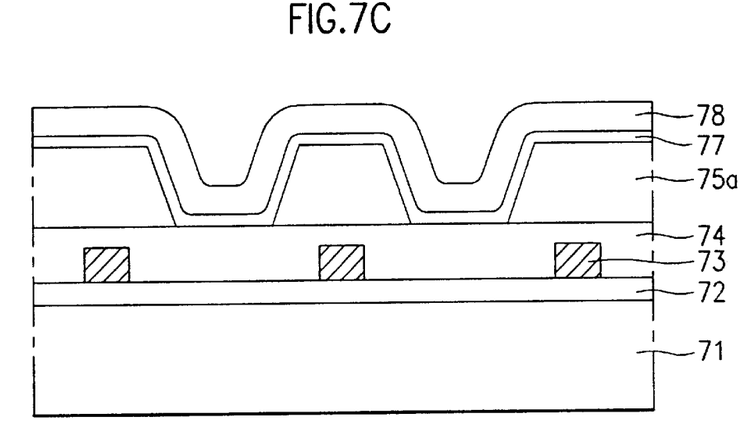
Figure 7D:
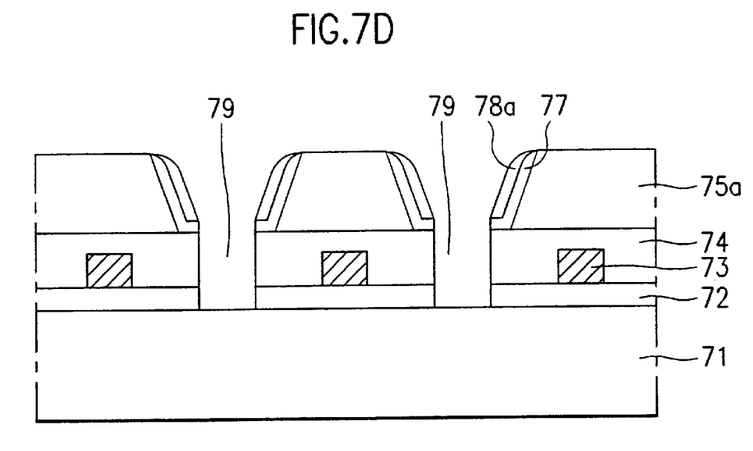
Figure 7E:
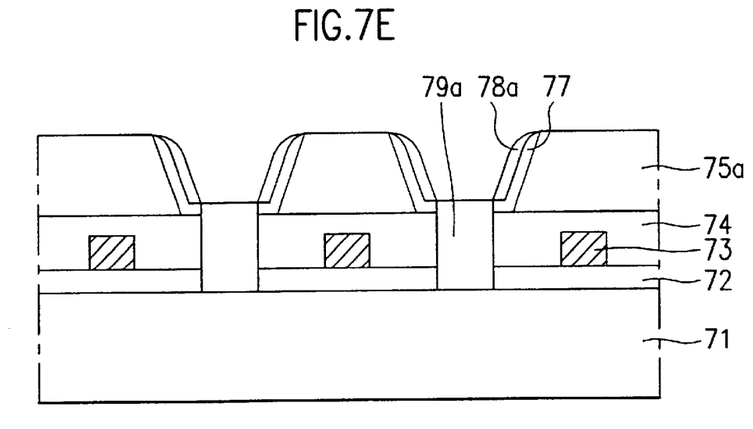
Figure 7F:
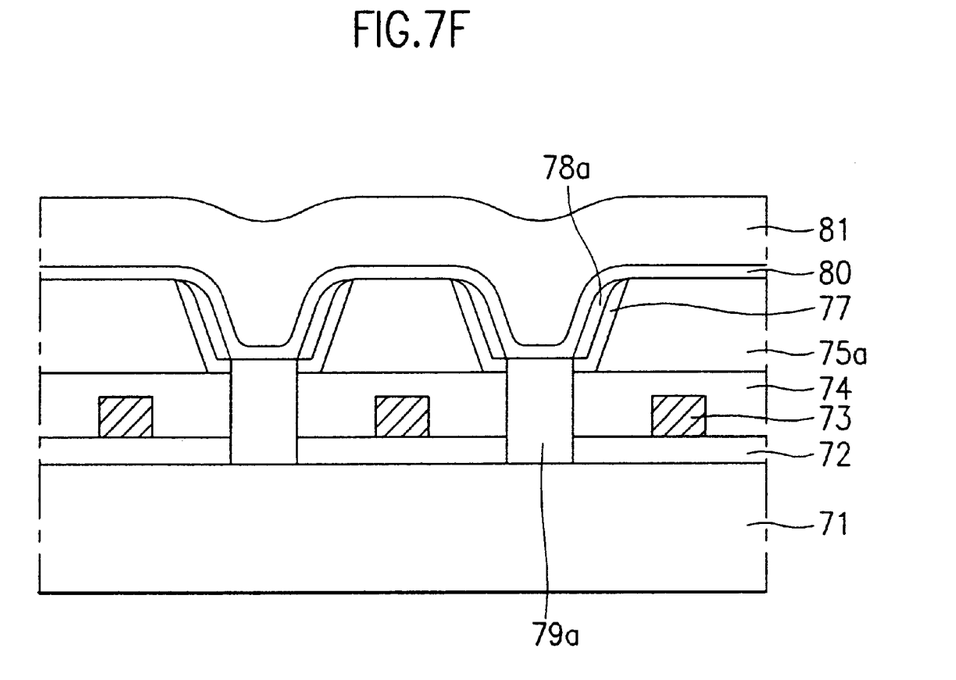
Figure 7G:
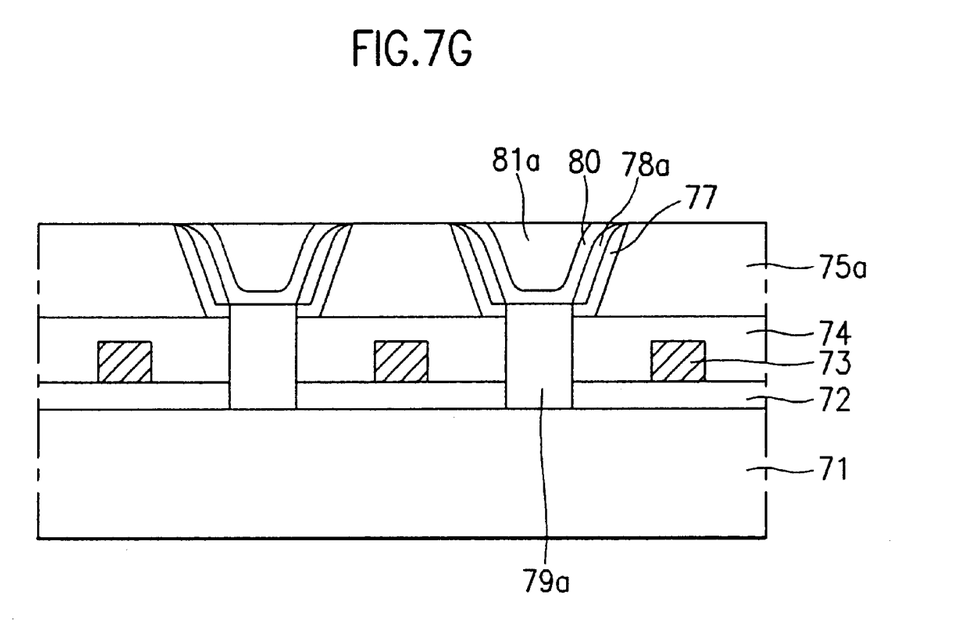

Referring to FIG. 7A, a first insulating layer 72 is formed on a semiconductor substrate 71 having a plurality of cell transistors and impurity diffusion regions formed therein, and a plurality of bitlines 73 are formed on the first insulating layer 72. A second insulating layer 72 is formed on the first insulating layer 72 inclusive of the bitlines 73, and a first conductive material 75 for capacitor upper electrode is formed on the first insulating layer 74. A first photoresist 76 is coated on the first conductive material 75, and patterned to define a capacitor upper electrode region. As shown in FIG. 7B, the patterned first photoresist 76 is used as a mask in selectively etching and removing the first conductive material 75, to form a capacitor upper electrode 75a. In the etching of the first conductive material 75 for forming the capacitor upper electrode 75a, the first conductive material 75 is etched to have a sloped etch surface, and a portion from which the first conductive material is removed is a portion in which a lower electrode is to be formed. Therefore, it can be known that regions in which an upper electrode and a lower electrode are to be formed is defined by one time of photolithography. Then, as shown in FIG. 7C, after removing the first photoresist 76, a capacitor dielectric film 77 is deposited on an entire surface inclusive of the capacitor upper electrode 75a, and a second conductive material 78 is formed on the capacitor dielectric film 76. As shown in FIG. 7D, the second conductive material 78 is etch back, to form sidewall spacers 78a of the second conductive material 78 on the capacitor dielectric film 77 at sides of the capacitor upper electrode 75a. The sidewall spacers 78a are used in etching and removing the capacitor dielectric film 77, the second insulating layer 74, and the first insulating layer 72, to form storage node contact holes 79 exposing the substrate 71 (impurity diffusion regions). Then, as shown in FIG. 7E, a conducive material is buried in the storage node contact hole 79, to form storage node contacts 79a. As shown in FIG. 7F, a reaction prevention film 80 is formed on an entire surface of the substrate 71 inclusive of the sidewall spacers 78a. The reaction prevention film 80 is formed of platinum Pt for preventing reaction between the storage node contacts 79a and capacitor lower electrodes to be formed later. And, a third conductive material 81 is deposited on the reaction prevention film 80. As shown in FIG. 7G, the third conductive material 81 and the reaction prevention film 80 are etched back until surfaces of the capacitor upper electrodes 75a are exposed, to form the capacitor lower electrodes 81a. In this instance, the capacitor dielectric film 77, the sidewall spacers 78a of the second conductive material 78 and the reaction prevention film 80 also act as a capacitor lower electrode, together with the capacitor lower electrode 81a. And, upon formation of an interlayer insulating film on an entire surface of the substrate 71 inclusive of the capacitor lower electrode 81a, the method for fabricating a capacitor in accordance with a third preferred embodiment of the present invention is completed. Though not shown in the drawing, a process for forming an insulating sidewall on an inside surface of the storage node contact hole 79 may be applied. The insulating sidewall is formed for preventing short between the bitline and the storage node contact.

As has been explained, the capacitor and the method for fabricating the same have the following advantages.

First, the formation of the capacitor lower electrode in electrical contact with the storage node contact after formation of the capacitor upper electrode minimizes parasitic capacitances between various signal lines inclusive of the parasitic capacitances between the capacitor lower electrode and the bitline.

Second, the fabrication process becomes simple because no additional oxidation prevention film is required for protection of the storage node contact from a strong oxidation atmosphere which is required in formation of a ferroelectric film for use as the capacitor dielectric film.

It will be apparent to those skilled in the art that various modifications and variations can be made in the capacitor and a method for fabricating the same of the present invention without departing from the spirit or scope of the invention. Thus, it is intended that the present invention cover the modifications and variations of this invention provided they come within the scope of the appended claims and their equivalents.

What is claimed is:

1. A capacitor comprising:
    a first insulating layer formed on a substrate;
    a bitline patterned on the first insulating layer;
    a second insulating layer formed on the bitline;
    a first electrode formed on the second insulating layer with slopes at both sides;
    a dielectric film formed on the first electrode;
    a node contact formed on one side of the first electrode and in contact with the substrate; and,
    a second electrode formed on the dielectric film and connected with the node contact, electrically.

2. A capacitor as claimed in claim 1, wherein the node contact is surrounded by sidewall spacers.

3. A capacitor as claimed in claim 1, further comprising a reaction prevention film provided between the dielectric film and the second electrode.

4. A capacitor as claimed in claim 3, wherein the reaction prevention film is formed of one of conductive material.

5. A capacitor as claimed in claim 1, further comprising conductive sidewall spacers between the dielectric film and the reaction prevention film.

* * * * *